(12) United States Patent
Chou

(10) Patent No.: US 9,911,626 B2
(45) Date of Patent: Mar. 6, 2018

(54) INTERPOSER SUBSTRATE AND METHOD FOR FABRICATING THE SAME

(71) Applicant: PHOENIX PIONEER TECHNOLOGY CO., LTD., Hukou Township (TW)

(72) Inventor: Pao-Hung Chou, Hukou Township (TW)

(73) Assignee: PHOENIX PIONEER TECHNOLOGY CO., LTD., Hukou Township (JP)

( * ) Notice: Subject to any disclaimer, the term of this patent is extended or adjusted under 35 U.S.C. 154(b) by 0 days.

(21) Appl. No.: 14/514,981

(22) Filed: Oct. 15, 2014

(65) Prior Publication Data

US 2016/0037634 A1 Feb. 4, 2016

(30) Foreign Application Priority Data

Jul. 31, 2014 (TW) .............................. 103126156 A

(51) Int. Cl.
| | |
|---|---|
| *H01L 21/48* | (2006.01) |
| *H01L 23/498* | (2006.01) |
| *H05K 3/40* | (2006.01) |
| *H05K 3/46* | (2006.01) |
| *H01L 23/13* | (2006.01) |

(52) U.S. Cl.
CPC .......... *H01L 21/4857* (2013.01); *H01L 23/13* (2013.01); *H01L 23/49811* (2013.01); *H05K 3/4007* (2013.01); *H05K 3/4682* (2013.01); *H01L 23/49822* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2924/15311* (2013.01); *H01L 2924/181* (2013.01); *H05K 2201/10378* (2013.01)

(58) Field of Classification Search
CPC ............ H01L 23/5389; H01L 21/4853; H01L 21/4857; H05K 1/11
USPC ........................................................ 257/737
See application file for complete search history.

(56) References Cited

U.S. PATENT DOCUMENTS

| | | | | |
|---|---|---|---|---|
| 2005/0161833 | A1* | 7/2005 | Takeuchi | ............... H01L 21/568 257/775 |
| 2009/0168380 | A1* | 7/2009 | Hsu | ...................... H01L 23/5389 361/761 |
| 2011/0254124 | A1* | 10/2011 | Nalla | ..................... H01L 23/645 257/531 |

(Continued)

*Primary Examiner* — Moazzam Hossain
(74) *Attorney, Agent, or Firm* — Steptoe & Johnson LLP

(57) ABSTRACT

A method of fabricating an interposer substrate provides a carrier having a first wiring layer. The first wiring layer has a plurality of first conductive pillars. A first insulating layer is formed on the carrier. The first conductive pillars are exposed from the first insulating layer. External connection pillars are formed above the first conductive pillars and electrically connected to the first conductive pillars. Then the carrier is removed. The process of fabricating the via can be bypassed in the process by forming a coreless interposer substrate on the carrier, such that the overall cost of the process can be decreased, and the process is simple. The interposer substrate is also provided.

5 Claims, 10 Drawing Sheets

(56) References Cited

U.S. PATENT DOCUMENTS

| | | | | |
|---|---|---|---|---|
| 2012/0227261 A1* | 9/2012 | Inui | ............... | H05K 1/186 |
| | | | | 29/849 |
| 2013/0008706 A1* | 1/2013 | Tseng | ............... | H01L 23/49827 |
| | | | | 174/266 |
| 2013/0062778 A1* | 3/2013 | Fujii | ............... | H05K 1/0251 |
| | | | | 257/774 |
| 2013/0277789 A1* | 10/2013 | Chen | ............... | H01L 27/14687 |
| | | | | 257/460 |
| 2014/0138817 A1* | 5/2014 | Paek | ............... | H01L 24/10 |
| | | | | 257/737 |
| 2014/0320231 A1* | 10/2014 | Seler | ............... | H01L 21/56 |
| | | | | 333/26 |
| 2015/0223332 A1* | 8/2015 | Nishida | ............... | H01L 21/563 |
| | | | | 174/261 |

* cited by examiner

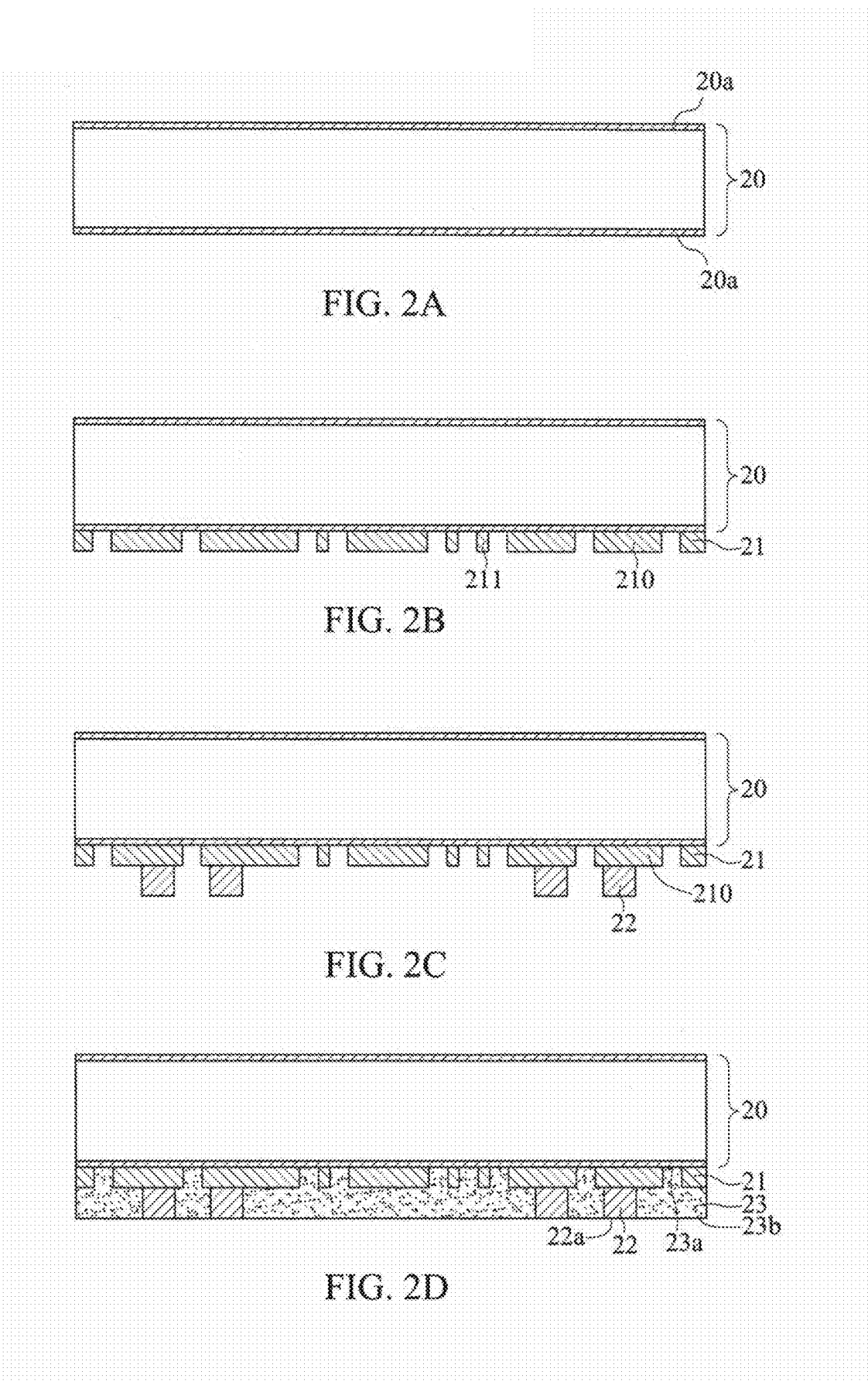

INTERPOSER SUBSTRATE AND METHOD FOR FABRICATING THE SAME

BACKGROUND OF THE INVENTION

1. Field of the Invention

This invention relates to interposer substrates, and, more particularly, to an interposer substrate for a package on package (PoP) and a method for fabricating the same.

2. Description of Related Art

With the evolution of technology in the semiconductor package, a semiconductor device has been developed different types of packages. In order to enhance electrical function and to save packaging space, a plurality of package structures are stacked so as to form a package on package (PoP). This packaging method can accomplish the heterogeneous integration features of a system in package (SiP), such that electronic components with different functions, such as memory, central processors, graphics processors, video processors and the like, are suitable for thin electronic products by stacking design so as to achieve the integration of the system.

In the early period, a package on package is formed from a memory packaging member (memory IC) by stacking a plurality of solder balls on a logic packaging member (logic IC). With the requirements of more compact and improve function of electronic products, the layout of the memory packaging member is more dense with nano units, such that the distance between contacts is smaller. However, the distance of the logic packaging member with micrometer units cannot be decreased to correspond to the distance of the memory packaging member, such that the memory packaging member with high circuit density has no suitable logic packaging member, and that electronic products cannot be effectively produced.

Therefore, in order to overcome the above problem, an interposer substrate 10 is disposed between the memory packaging member 11 and the logic packaging member 12. As illustrated in FIG. 1, the bottom end of the interposer substrate 10 is electrically connected with the logic packaging member 12 having a logic chip 120 with larger distance, and the upper end of the interposer substrate 10 is electrically connected with the memory packaging member 11 having a memory chip 110 with smaller distance.

However, in the prior package on package 1, a plurality of solder balls 13 are used as supporting and electrically connecting members. Further, as the number of contact of electronic products (i.e., I/O) are increasing, and the size of packaging member is constant, the distance between the solder balls 13 has to be decreased, such that bridging phenomenon is easily occurred during reflowing and thus short circuit is induced, and that it further results in extremely low product yield and poor reliability.

Therefore, it is developed that the solder ball 13 is replaced by a copper pillar. The height of the copper pillars can remain consistency through the characteristic of the copper pillar not deforming during reflowing, such that the bridging problem can be avoided, and the product yield can be increased.

FIGS. 1A-1D are schematic sectional views of a method of fabricating an interposer substrate 10 according to the prior art.

As illustrated in FIG. 1A, a plate 10' such as a copper foil substrate is penetrated so as to form a plurality of vias 100.

As illustrated in FIG. 1B, wiring layers 15 are formed on two sides of the plate 10' through the copper foil 10a, and a plurality of conducting holes 16 are formed in the vias 100 so as to be electrically connected to the wiring layers 15.

As illustrated in FIG. 1C, an insulating protection layer 17 is formed on the plate 10' and the wiring layer 15 and exposes a portion of the wiring layer 15 for an electrical contact pad 150 to be provided thereon.

As illustrated in FIG. 1D, a copper pillar 14 is formed on the electrical contact pad 150 in an electroplating process.

However, the method of fabricating the interposer substrate 10 according to the prior art is complicated, such as forming the vias 100, such that the cost is high. Besides, an additional conducting layer 140 has to be formed so as to make copper pillars 14 in an electroplating process on one side or two side under requirements. Therefore, a little bit of conducting layer 140 may usually be remained when unnecessary conducting layer 140 is removed, such that the conductivity of the copper pillars 14 may be affected. For example, the rest of the conducting layer 140 may electrically connect adjacent copper pillars 14, and thus resulting in short circuit. In the consequence, the overall conductivity of the interposer substrate 10 may decrease.

Further, the thickness of the interposer substrate 10 may be limited under the consideration of the plate 10' (i.e., the core layer). For example, the interposer substrate is hard to be made thin. Accordingly, the interposer substrate not only is hard to be produced but also easily has problems of damages to the plate 10' when the thickness of the interposer substrate is thinner (below 130 um).

Further, the line width/line space (L/S) design of the wiring layer 15 is easily limited. In general, the smallest line width/line space of the fabricating process of a substrate is merely 12/12 um. However, when the L/S is below 25/25 um, the product yield is readily affected.

Therefore, how to overcome the various problems of the prior art has become the emergency issues that need to be resolved.

BRIEF SUMMARY OF THE INVENTION

In view of the above defects of the prior art, the present invention provides an interposer substrate, comprising: a first insulating layer having a first surface and a second surface opposing the first surface; a first wiring layer formed on the first surface of the first insulating layer; a plurality of first conductive pillars formed in the first insulating layer and connected to the second surface of the first insulating layer; and a plurality of external connection pillars disposed on the first conductive pillars such that the first conductive pillars electrically connect the external connection pillars and the first wiring layer.

This invention further provides a method of fabricating an interposer substrate, comprising: providing a carrier having a first wiring layer, the first wiring layer having a plurality of first conductive pillars; forming on the carrier a first insulating layer that has a first surface and a second surface opposing the first surface and is attached to the carrier via the first surface, in a manner that the first conductive pillars are exposed from the second surface of the first insulating layer; forming on the first conductive pillars external connection pillars electrically connected to the first conductive pillars; and removing the carrier, such that the first wiring layer is exposed from the first surface of the first insulating layer.

In an embodiment, the carrier is completely removed.

In an embodiment, the first insulating layer is formed on the carrier by a molding process, a coating process or a pressing process, such that the first insulating layer is formed of molding compound, primer or dielectric material.

In an embodiment, a surface of the first wiring layer is lower than the first surface of the first insulating layer.

In an embodiment, an end surface of the first conductive pillar is flush with the second surface of the first insulating layer.

In an embodiment, a second wiring layer is formed on the second surface of the first insulating layer and the first conductive pillars before the external connection pillars are formed, such that the second wiring layer is disposed between the external connection pillars and the first conductive pillars, and the second wiring layer electrically connects the external connection pillars and the first conductive pillars after the external connection pillars are formed. Further, an insulating protection layer is formed on the second surface of the first insulating layer and the second wiring layer and exposes a portion of the second wiring layer from the insulating layer for providing electrical contact pads so as to receive the external connection pillars before the external connection pillars are formed.

In an embodiment, a wiring build-up layer structure is formed on the second surface of the first insulating layer and the first conductive pillars before the external connection pillars are formed, such that the wiring build-up layer structure is disposed between the external connection pillars and the first conductive pillars and electrically connects the external connection pillars and the first conductive pillars after the external connection pillars are formed. In an embodiment, the wiring build-up layer structure comprises at least a second insulating layer, a second wiring layer formed in the second insulating layer, and a plurality of conductors disposed on the second wiring layer, and the external connection pillars are disposed on the conductors. Alternatively, the wiring build-up layer structure comprises at least a second insulating layer and a second wiring layer formed in the second insulating layer, and the external connection pillars are disposed on the second wiring layer.

In an embodiment, the conductors are conductive pillars.

In an embodiment, the wiring build-up layer structure is fabricated by: forming the second wiring layer on the second surface of the first insulating layer and the first conductive pillars; forming the plurality of conductors on the second wiring layer; and forming the second insulating layer on the second surface of the first insulating layer, such that the second insulating layer encapsulates the second wiring layer and the conductors, and the conductors are exposed from the second insulating layer.

Alternatively, the wiring build-up layer structure is fabricated by: forming the second wiring layer on the second surface of the first insulating layer and the first conductive pillars; forming the second insulating layer on the second surface of the first insulating layer, such that the second insulating layer encapsulates the second wiring layer; forming a plurality of openings on the second insulating layer; and forming the conductors in the openings and exposing the conductors from the second insulating layer.

In an embodiment, the carrier is partially removed, such that the remaining carrier is used as a supporting structure disposed on the first surface of the first insulating layer.

In the interposer substrate and the method for fabricating the same according to the present invention, the coreless interposer substrate is formed on the carrier, such that in the process, the fabrication process of via may be eliminated, and the prior insulating protection layer is unnecessary by forming the first insulating layer. Accordingly, the cost of the overall process in an embodiment is low and the process is simple.

Further, the interposer substrate without the limitation of the prior plate not only is readily produced but also has no problem of plate damages. In addition, wirings with more fine line width/line space (L/S) can be produced so as to increase the density of layout.

BRIEF DESCRIPTION OF THE DRAWINGS

FIGS. 2A-2F are schematic sectional views of a method of fabricating an interposer substrate according to a first embodiment of the present invention, wherein FIG. 2F' is another aspect of FIG. 2F;

DETAILED DESCRIPTION OF THE INVENTION

Figure 1:
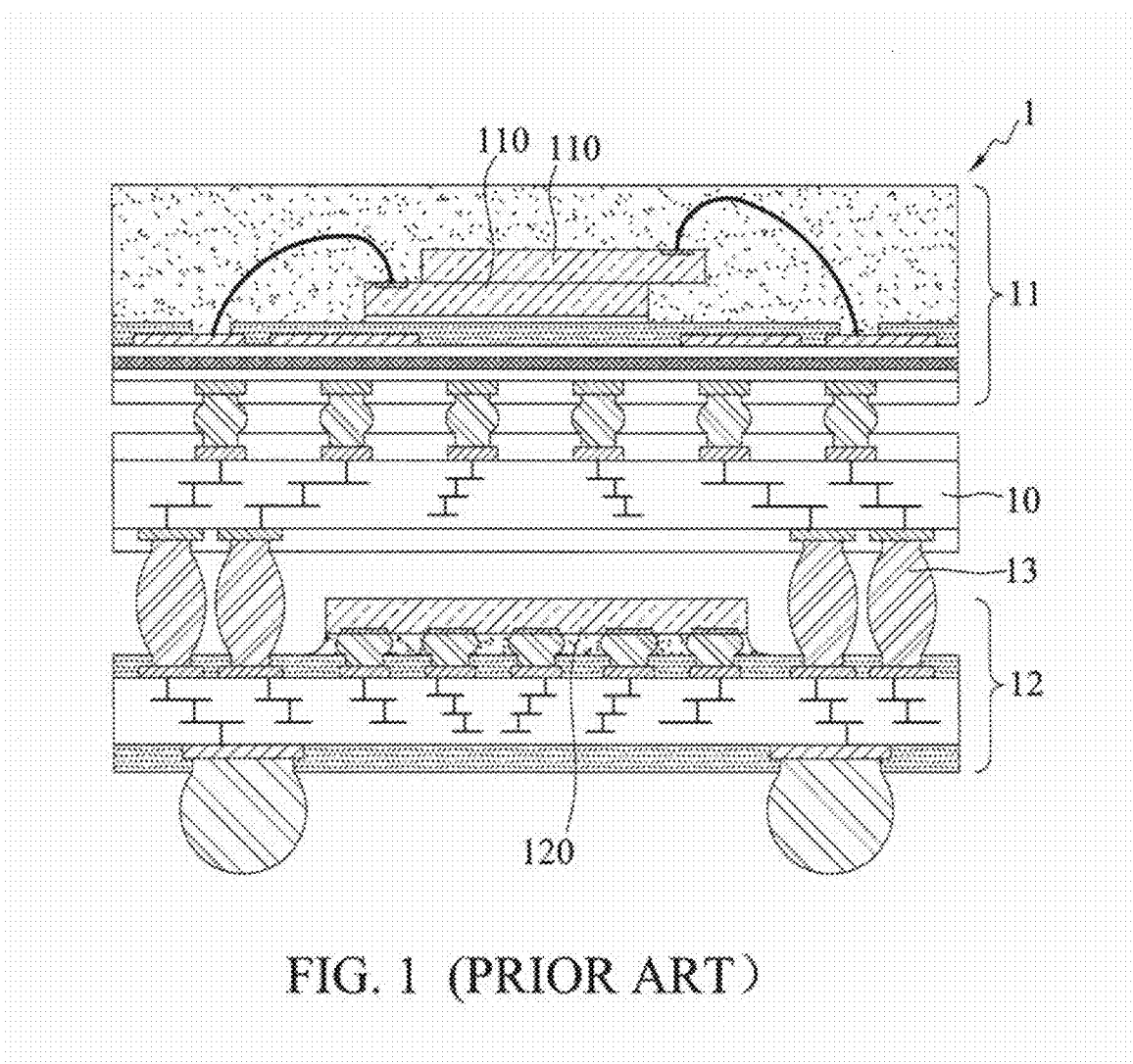
FIG. 1 is a schematic sectional view of a package on package (PoP) according to the prior art.
Figure 1A:
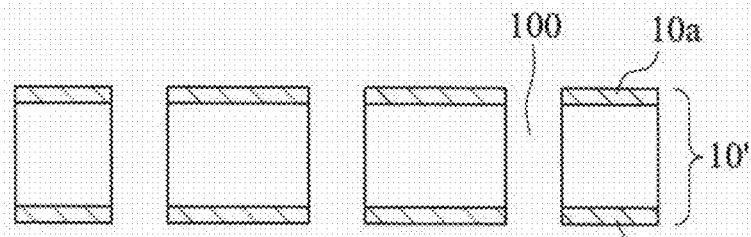
FIGS. 1A-1D are schematic sectional views of a method of fabricating an interposer substrate according to the prior art.
Figure 1B:
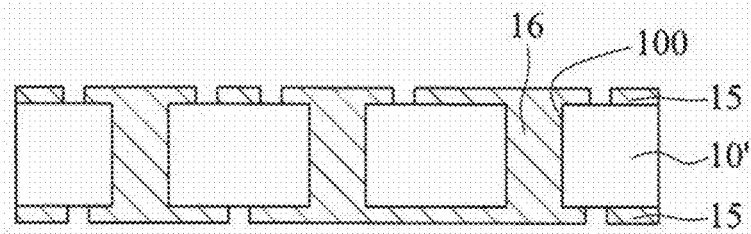
Figure 1C:
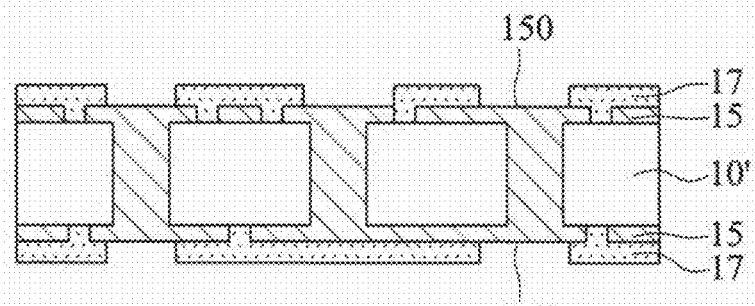
Figure 1D:
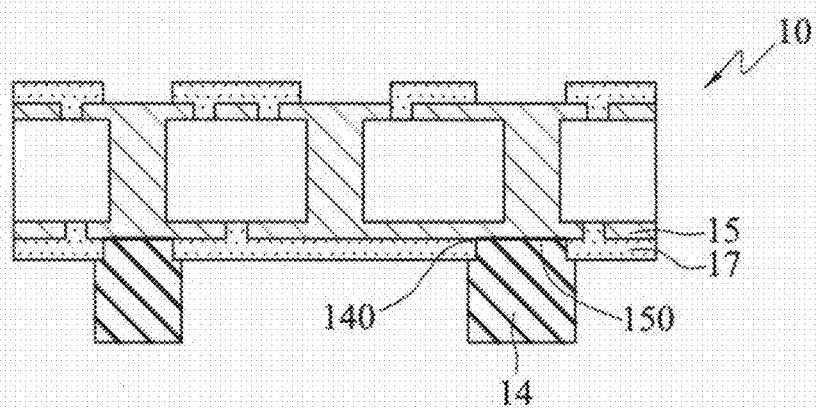

The following is explanation of the disclosed embodiments by examples, and those who are familiar with this technical field can easily understand the advantages and efficacy by the explanation.

Notice that the illustrated structure, ratio and size of appended figures in the explanation are only used for the disclosed embodiments in the explanation for understanding and reading of those who are familiar with this technical field. It is not applicable for limiting implementing condition of the disclosed embodiments, so the illustration doesn't have actual meaning in the technical field. Any modification of structure, change of ratio and adjustment of size should fall in the disclosed embodiments when the efficacy and purpose of the disclosed embodiments are not affected. Meanwhile, the terms that are quoted in the explanation like "upper," "first," "second," "a" and so on only intent for convenience of description rather than limiting feasible scope of the disclosed embodiments. Change or adjustment of relative relationship under no actual alteration of content of technique should be seen as feasible scope of the disclosed embodiments.

FIGS. 2A-2F are schematic sectional views of a method of fabricating a coreless interposer substrate 2 according to a first embodiment of the present invention.

As illustrated in FIG. 2A, a carrier 20 is provided. In an embodiment, the carrier 20 is a substrate, such as, but not limited to, a copper foil substrate or a silicon-containing plate. In an embodiment, the copper foil with metal material 20a on two sides thereof is for explanation.

As illustrated in FIG. 2B, a first wiring layer 21 is formed on the carrier 20 through a patterning process.

In an embodiment, the first wiring layer 21 has a plurality of electrical connection pads 210 and a plurality of conducting traces 211.

As illustrated in FIG. 2C, a plurality of first conductive pillars 22 are formed on the electrical connection pads 210 of the first wiring layer 21 in an electroplating way through a patterning process.

As illustrated in FIG. 2D, a first insulating layer 23 is formed on the carrier 20. The first insulating layer 23 has a first surface 23a and a second surface 23b opposing the first surface 23a. The first insulating layer 23 is connected on the carrier 20 via the first surface 23a. The first conductive pillars 22 are exposed to the second surface 23b of the first insulating layer 23.

In an embodiment, the first insulating layer 23 is formed on the carrier 20 by a molding process, a coating process or a pressing process. The first insulating layer 23 is formed of molding compound, primer or dielectric material such as epoxy.

Further, an end surface 22a of the first conductive pillar 22 is flush with the second surface 23b of the first insulating layer 23.

Figure 2E:
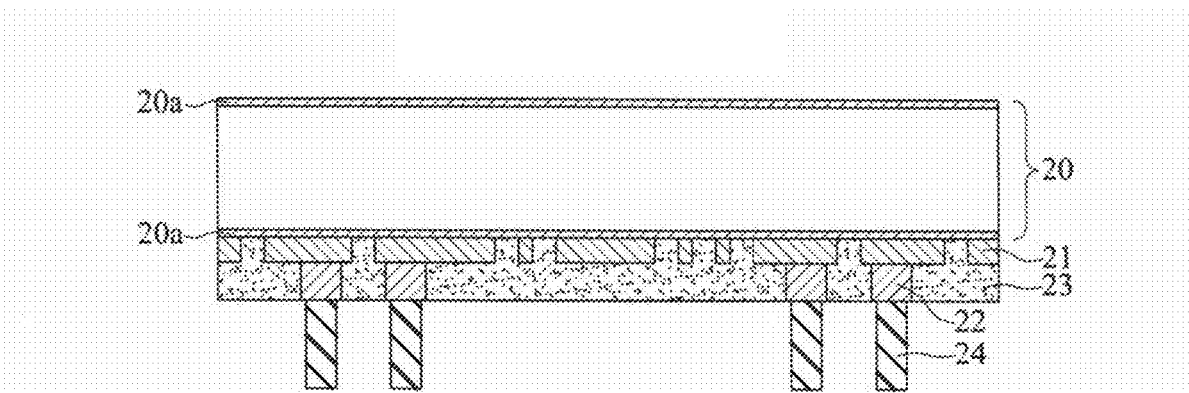

As illustrated in FIG. 2E, a plurality of external connection pillars 24 are formed on the first conductive pillars 22 in an electroplating way through a patterning process, and the external connection pillars 24 are electrically connected to the first conductive pillars 22.

Figure 2F:
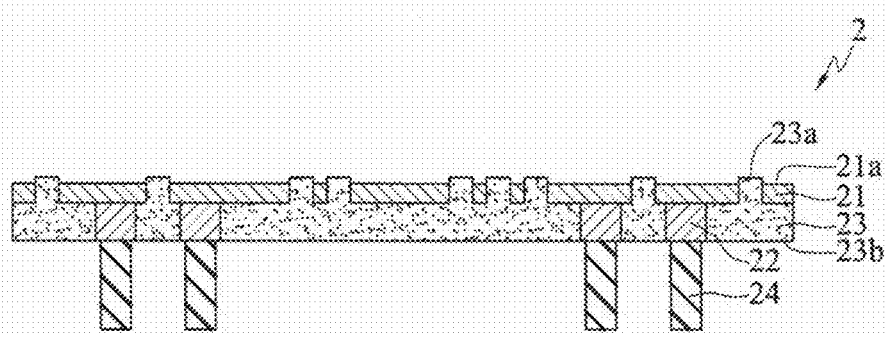
Figure 2F:
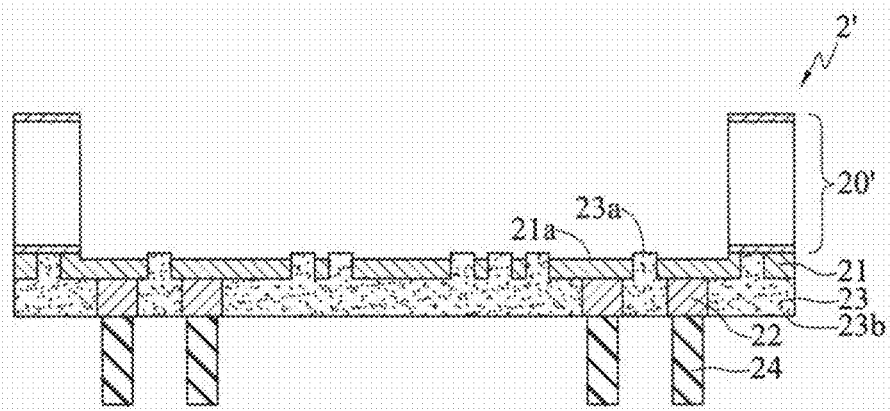

As illustrated in FIG. 2F, the carrier 20 is completely removed, such that the surface 21a of the first wiring layer 21 is exposed to the first surface 23a of the first insulating layer 23, and the surface 21a of the first wiring layer 21 is lower than the first surface 23a of the first insulating layer 23.

In an embodiment, the metal material 20a is removed in an etching process, and an upper surface 21a of the first wiring layer 21 is etched, such that the upper surface 21a of the first wiring layer 21 is slightly lower that the first surface 23a of the first insulating layer 23.

As illustrated in 'FIG. 2F', a portion of the carrier 20 is removed in a patterning process, such that the remaining carrier is used as the supporting structure 20', and the surface 21a of the first wiring layer 21 is exposed to the first surface 23a of the first insulating layer 23.

Therefore, in the method according to the first embodiment, the interposer substrate 2, 2' is a coreless monolayer wiring design (merely having the first wiring layer 21), such that in the process, the fabrication process of via may be eliminated, and the prior insulating protection layer is unnecessary by forming the first insulating layer 23. Accordingly, the cost of the overall process in an embodiment is low and the process is simple.

Further, compared with the prior interposer substrate, the interposer substrate 2, 2' without the limitation of the prior plate not only is readily produced but also has no problem of plate damages. In addition, wirings with more fine line width/line space (L/S) can be produced so as to increase the density of layout.

Further, in an embodiment, if the carrier 20 has a metal material, the metal material 20a is used as the conducting layer, such that the external connection pillars 24 may be produced in the electroplating way without forming an additional conducting layer. Accordingly, there is no problem of remaining conducting layer affecting the conductivity of the external connection pillars 24, and the overall conductivity of the interposer substrate 2, 2' may be increased.

FIGS. 3A-3D are schematic sectional views of the method of fabricating the interposer substrate 3 according to a second embodiment in the present invention. The second embodiment differs from the first embodiment in the variation of subsequent process in FIG. 2D.

Figure 3A:
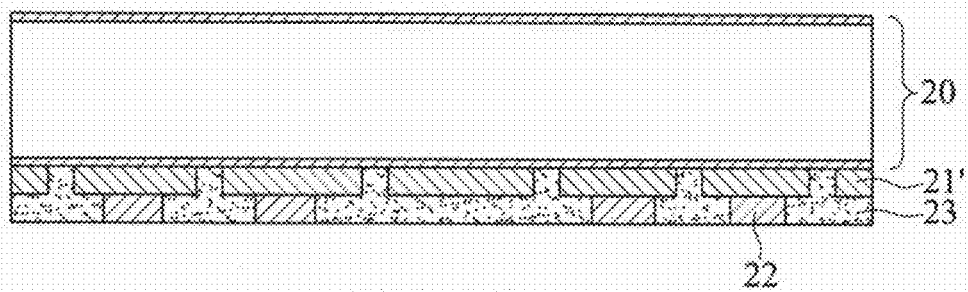
FIGS. 3A-3D are schematic sectional views of the method of fabricating the interposer substrate according to a second embodiment of the present invention, wherein FIG. 3D' is another aspect of FIG. 3D.

As illustrated in FIG. 3A, it is the structure as illustrated in FIG. 2D, and the first wiring layer 21' is a plurality of electrical connection pads without any conducting trace.

Figure 3B:
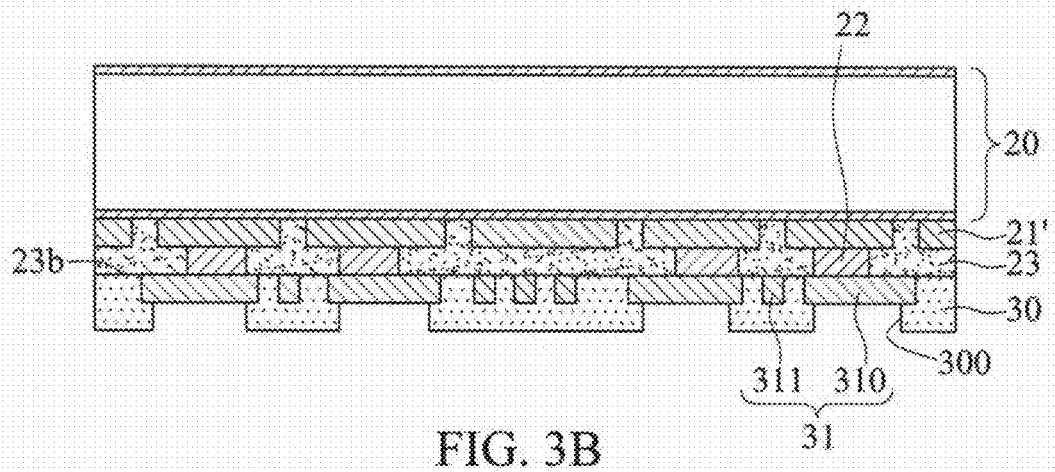

As illustrated in FIG. 3B, a second wiring layer 31 is formed on the second surface 23b of the first insulating layer 23 and the first conductive pillars 22.

In an embodiment, the second wiring layer 31 has a plurality of electrical contact pads 310 and a plurality of conducting traces 311.

Further, the position of the electrical contact pad 310 corresponds to that of the first conductive pillar 22. In other embodiment, the position of the electrical contact pad 310 may not correspond to that of the first conductive pillar 22.

Further, an insulating protection layer 30 such as solder mask may be formed on the second surface 23b of the first insulating layer 23 and the second wiring layer 31, and the insulating protection layer 30 has a plurality of openings 300, such that the electrical contact pad 310 is exposed from the opening 300.

Figure 3C:
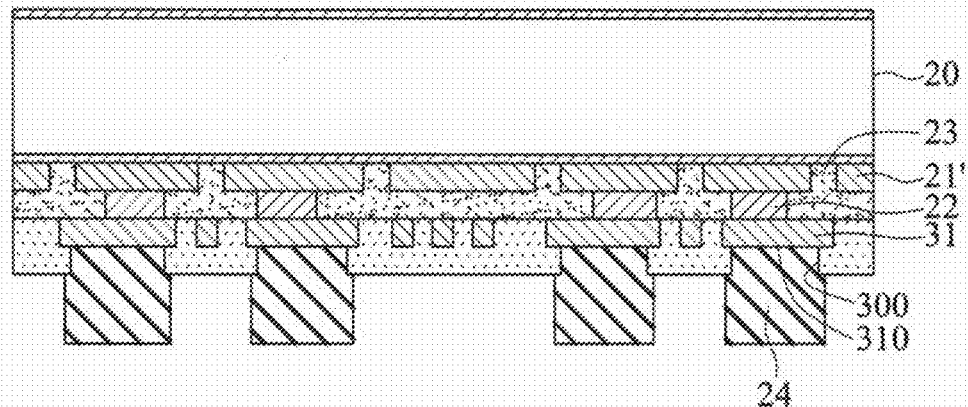

As illustrated in FIG. 3C, a plurality of external connection pillars 24 are formed on the electrical contact pads 310 in the openings 300, such that the second wiring layer 31 is disposed between the external connection pillars 24 and the first conductive pillars 22, and the second wiring layer 31 is electrically connected to the external connection pillars 24 and the first conductive pillars 22.

Figure 3D:
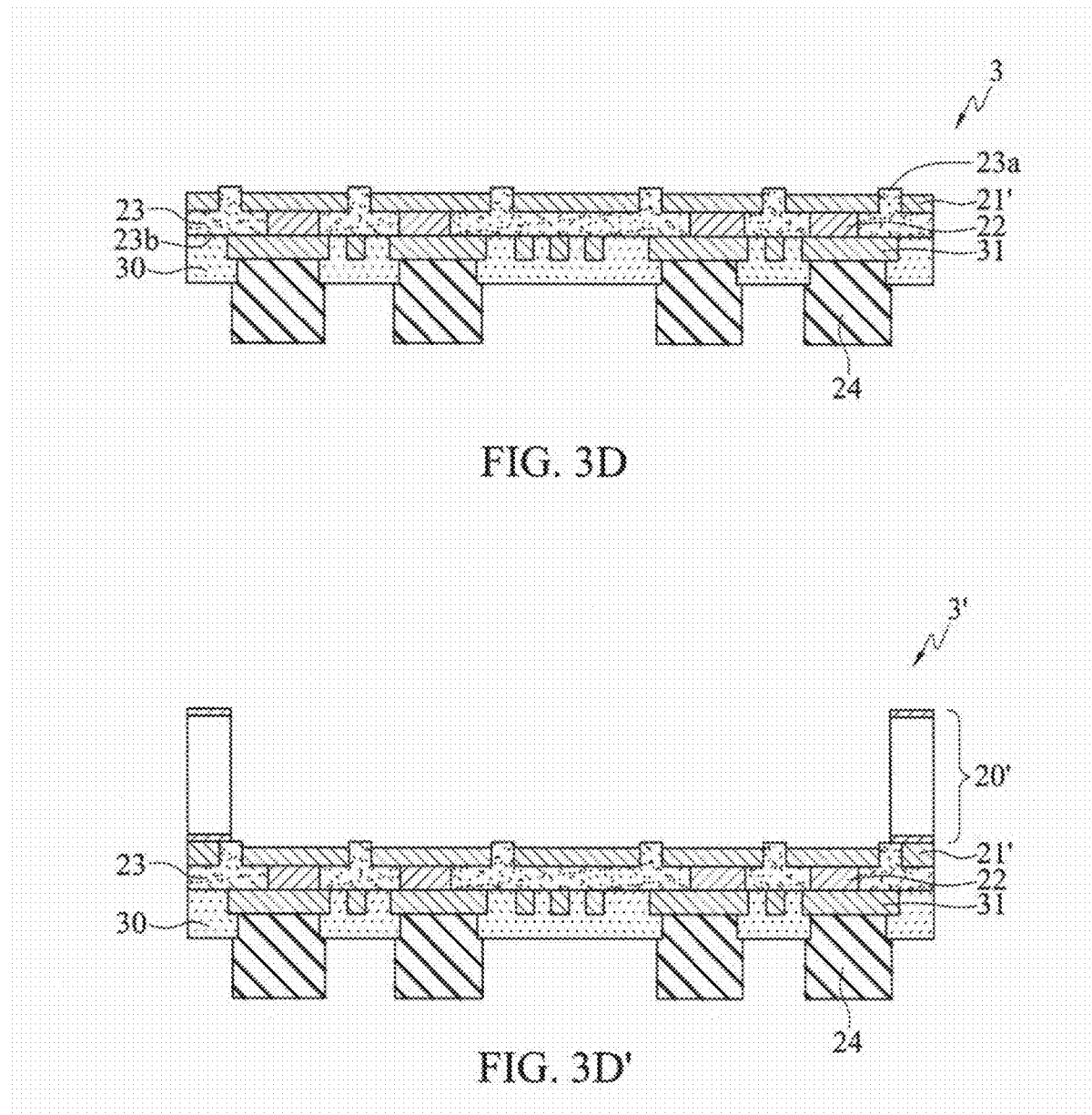

As illustrated in FIG. 3D, the carrier 20 is completely removed, such that the first wiring layer 21' is exposed to the first surface 23a of the first insulating layer 23.

As illustrated in FIG. 3D', a portion of the carrier 20 is removed in a patterning process, such that the remaining carrier is used as the supporting structure 20', and the first wiring layer 21' is exposed to the first surface 23a of the first insulating layer 23.

Therefore, in the second embodiment, the major layout of the interposer substrate 3, 3' is the second wiring layer 31.

FIGS. 4A-4D are schematic sectional views of the method of fabricating the interposer substrate 4 according to a third embodiment in the present invention. The third embodiment differs from the first embodiment in the variation of subsequent process in FIG. 2D.

Figure 4A:
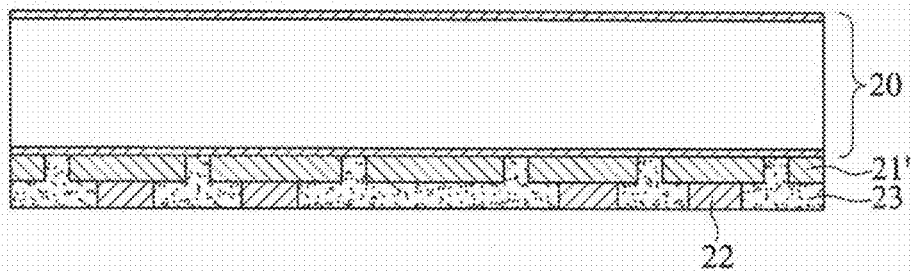
FIGS. 4A-4D are schematic sectional views of the method of fabricating the interposer substrate according to a third embodiment of the present invention, wherein FIG. 4B' is another aspect of FIG. 4B, and FIG. 4D' is another aspect of FIG. 4D.

As illustrated in FIG. 4A, it is the structure as illustrated in FIG. 3A, and the first wiring layer 21' is a plurality of electrical connection pads without any conducting trace.

Figure 4B:
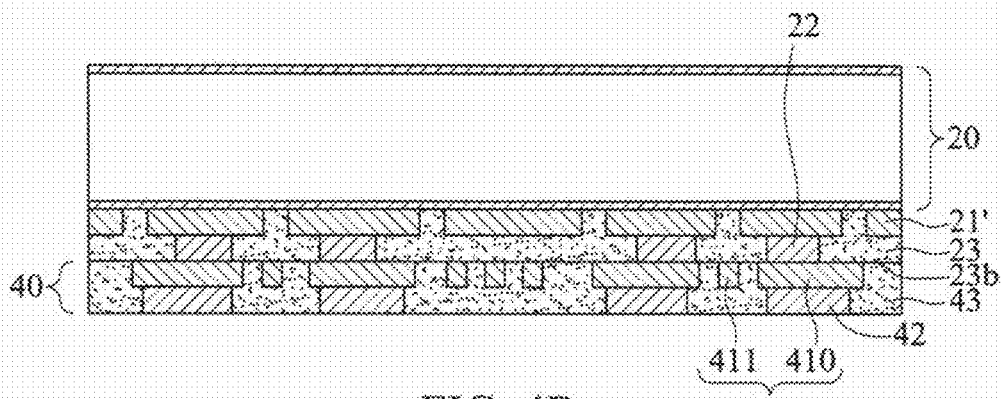
Figure 4B:
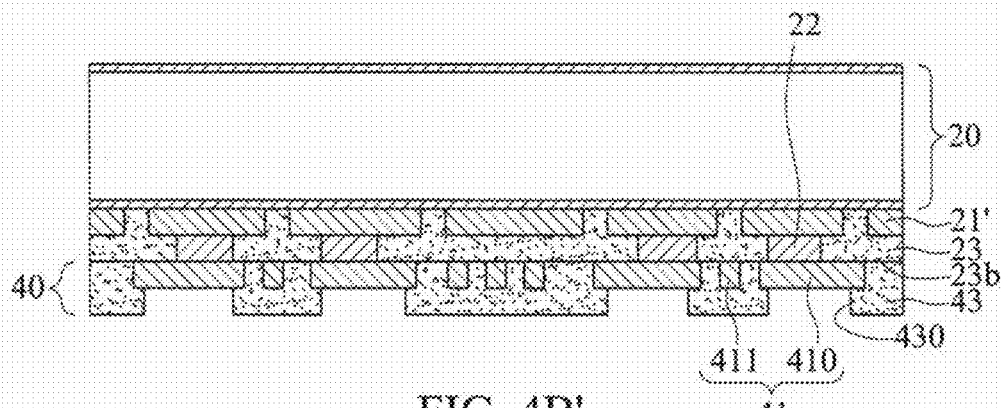

As illustrated in FIG. 4B, a wiring build-up layer structure 40 is formed on the second surface 23b of the first insulating layer 23 and the first conductive pillars 22.

In an embodiment, the wiring build-up layer structure 40 comprises at least a second insulating layer 43, a second wiring layer 41 formed in the second insulating layer 43, and a plurality of conductors 42 formed on the second wiring layer 41.

Further, the second wiring layer 41 comprises a plurality of electrical contact pads 410 and a plurality of conducting traces 411. The second insulating layer 43 is formed of molding compound, epoxy or dielectric material.

Further, the conductors 42 may be conductive pillars or conducting blind holes. If the conductors 42 are the conductive pillars, the wiring build-up layer structure 40 is fabricated according to FIGS. 2B to 2D. The second wiring layer 41 is formed on the second surface 23b of the first insulating layer 23 and the first conductive pillars 22. Then the plurality of conductors 42 are formed on the second wiring layer 41. The second insulating layer 43 is formed on the second surface 23b of the first insulating layer 23, such that the second insulating layer 43 encapsulates the second wiring layer 41 and the conductors 42, and the conductors 42 are exposed to the second insulating layer 43.

Alternatively, if the conductors 42 are the conducting blind holes, the wiring build-up layer structure 40 is fabricated by forming the second wiring layer 41 on the second surface 23b of the first insulating layer 23 and the first conductive pillars 22. Then, the second insulating layer 43 is formed on the second surface 23b of the first insulating layer 23, such that the second insulating layer 43 encapsulates the second wiring layer 41. After that, a plurality of openings 430 are formed in the second insulating layer 43, as illustrated in 'FIG. 4B'. At last, the plurality of conductors 42 are formed in the openings 430, and the conductors 42 are exposed from the second insulating layer 43. Since the second insulating layer 43 may be a photosensitive material, the openings 430 may be made in exposure developing method.

Figure 4C:
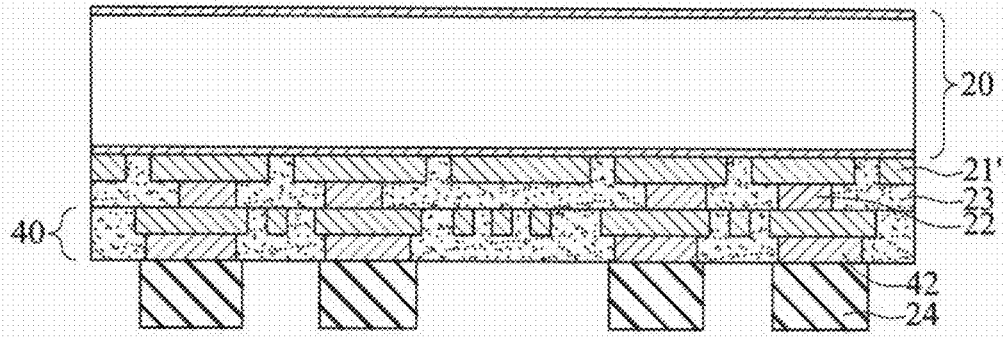

As illustrated in FIG. 4C, a plurality of external connection pillars 24 are formed on the conductors 42, such that the wiring build-up layer structure 40 is disposed between the external connection pillars 24 and the first conductive pillars 22, and the wiring build-up layer structure 40 is electrically connected to the external connection pillars 24 and the first conductive pillars 22.

In an embodiment, the wiring build-up layer structure 40 is electrically connected to the external connection pillars 24 and the first conductive pillars 22 through the second wiring layer 41 and the conductors 42.

In another embodiment, a wiring build-up layer structure having a multilayer of the second insulating layer (comprising the second wiring layer and the conductor) may be made based on requirements.

Figure 4D:
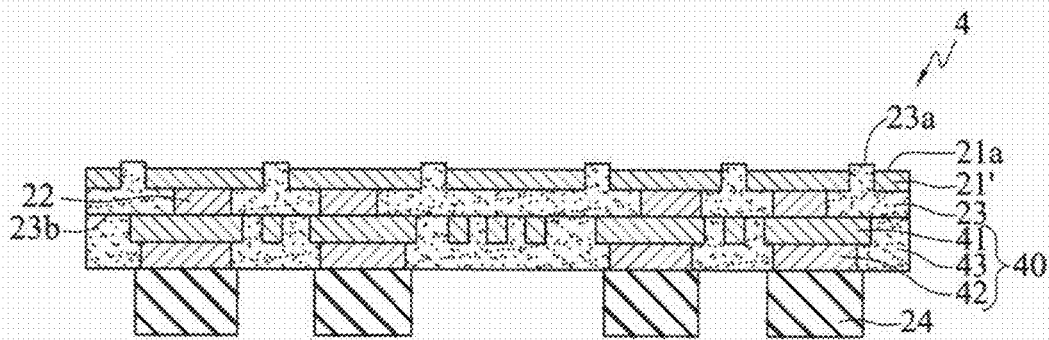
Figure 4D:
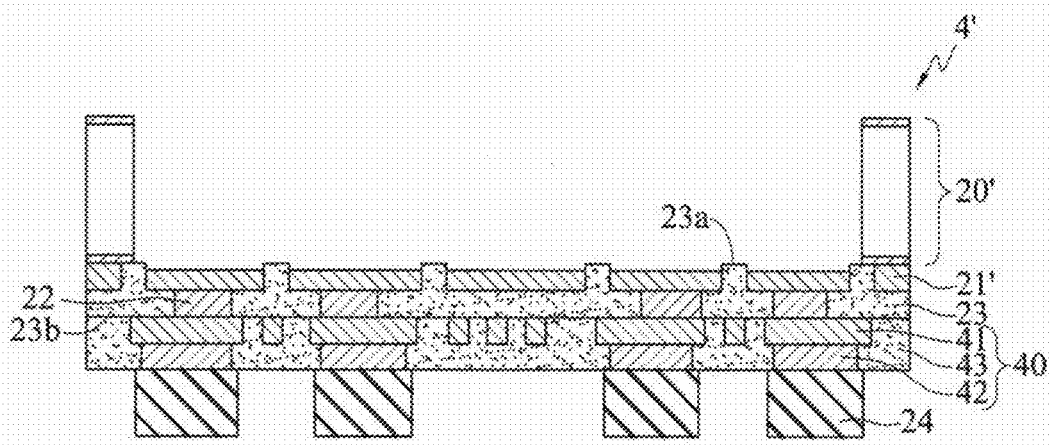

As illustrated in FIG. 4D, the carrier 20 is completely removed, such that the first wiring layer 21' is exposed to the first surface 23a of the first insulating layer 23.

As illustrated in FIG. 4D', a portion of the carrier 20 is removed in a patterning process, such that a remaining of the carrier is used as the supporting structure 20', and the first wiring layer 21' is exposed to the first surface 23a of the first insulating layer 23.

Therefore, in the third embodiment the second insulating layer 43 replaces the insulating protection layer 30, so as to decrease the cost.

FIGS. 5A-5D are schematic sectional views of the method of fabricating the interposer substrate 5 according to a fourth embodiment of the present invention. The fourth embodiment differs from the third embodiment in that the conductors 42 are not fabricated.

Figure 5A:
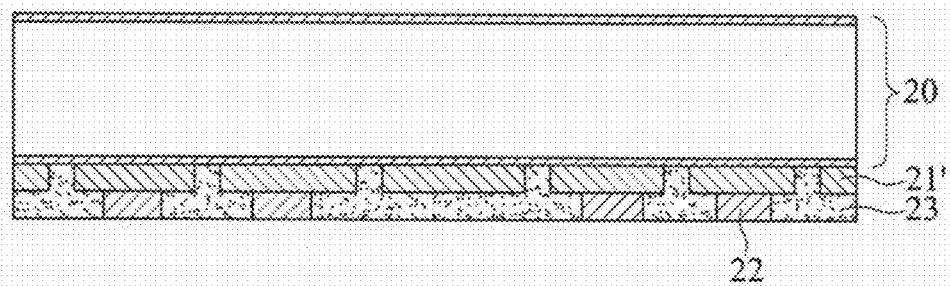
FIGS. 5A-5D are schematic sectional views of the method of fabricating the interposer substrate according to a fourth embodiment of the present invention, wherein FIG. 5D' is another aspect of FIG. 5D.

As illustrated in FIG. 5A, it is the structure as illustrated in FIG. 4A, and the first wiring layer 21' is a plurality of electrical connection pads without any conducting trace.

Figure 5B:
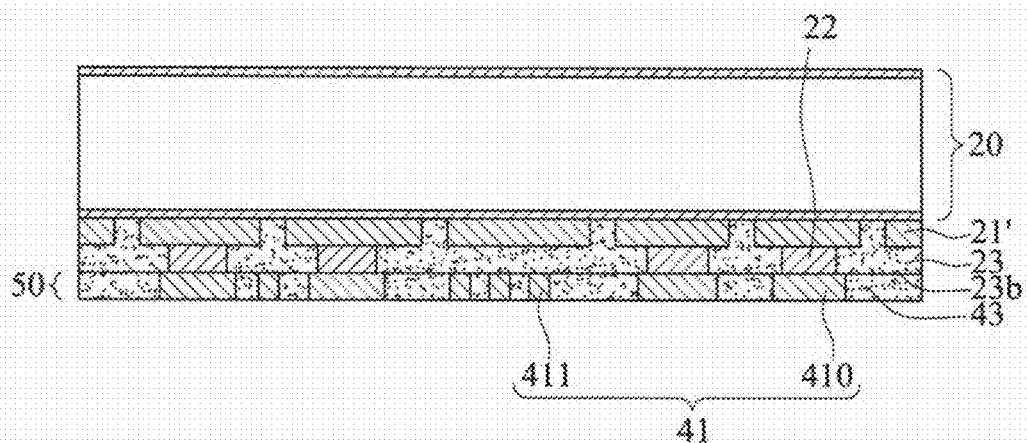

As illustrated in FIG. 5B, a wiring build-up layer structure 50 is formed on the second surface 23b of the first insulating layer 23 and the first conductive pillars 22.

In an embodiment, the wiring build-up layer structure 50 comprises at least a second insulating layer 43 and a second wiring layer 41 formed in the second insulating layer 43.

Further, the second wiring layer 41 comprises a plurality of electrical contact pads 410 and a plurality of conducting traces 411, and the second insulating layer 43 is made of molding compound, epoxy or dielectric material.

Figure 5C:
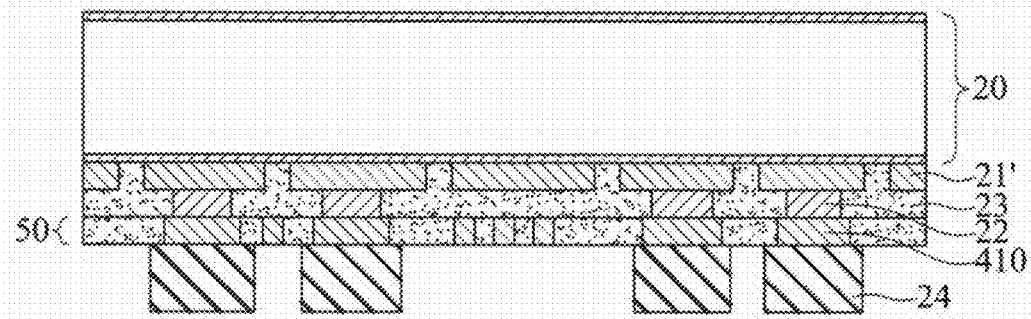

As illustrated in FIG. 5C, a plurality of external connection pillars 24 are formed on the electrical contact pads 410, such that the wiring build-up layer structure 50 is disposed between the external connection pillars 24 and the first conductive pillars 22, and the wiring build-up layer structure 50 is electrically connected to the external connection pillars 24 and the first conductive pillars 22.

In an embodiment, the wiring build-up layer structure 50 is electrically connected to the external connection pillars 24 and the first conductive pillars 22 through the second wiring layer 41.

In another embodiment, a wiring build-up layer structure having a multilayer of second insulating layer and second wiring layer may be made based on requirements.

Figure 5D:
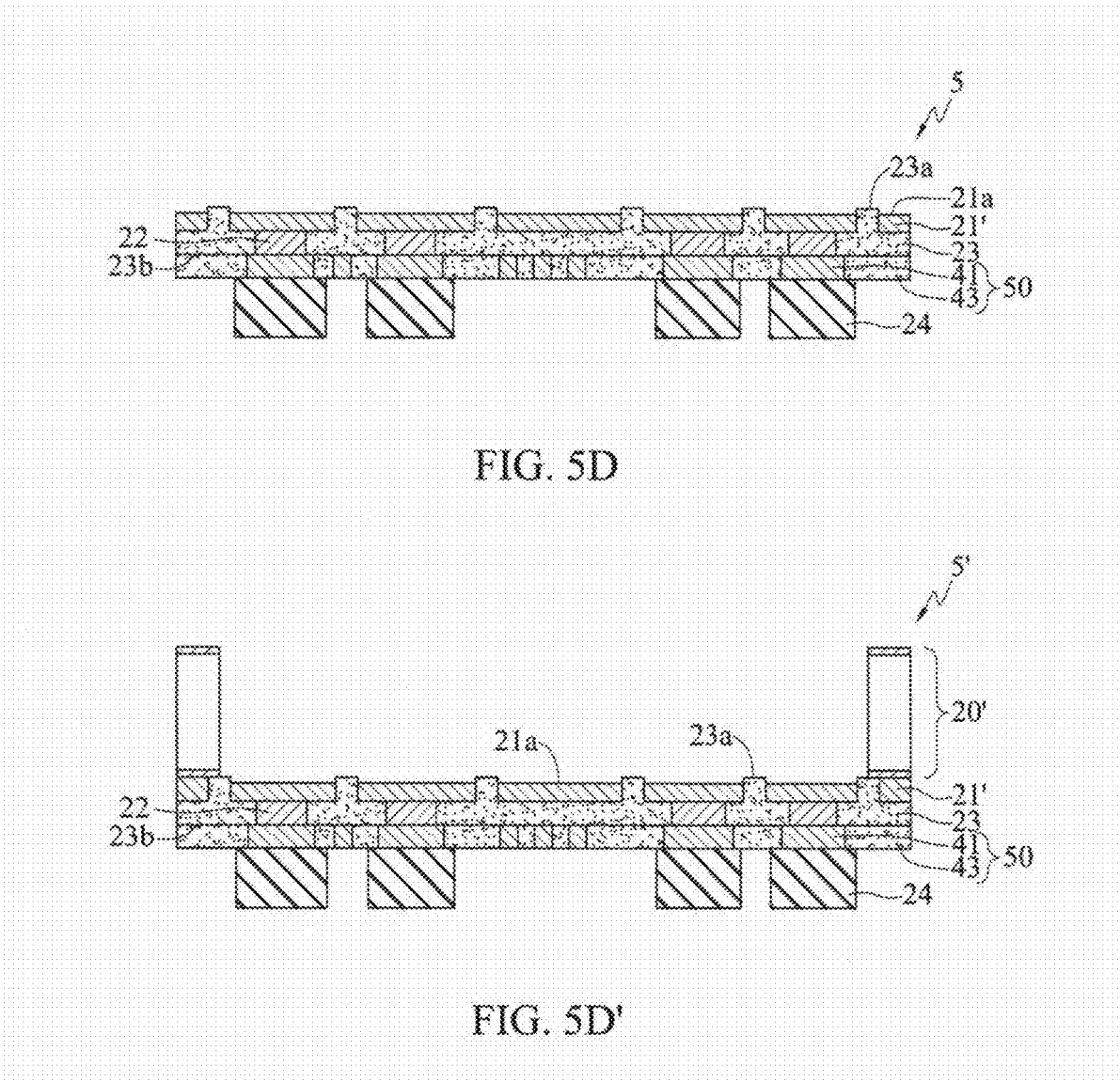

As illustrated in FIG. 5D, the carrier 20 is completely removed, such that the first wiring layer 21' is exposed to the first surface 23a of the first insulating layer 23.

As illustrated in FIG. 5D', a portion of the carrier 20 is removed in a patterning process, such that the remaining carrier is used as the supporting structure 20', and the first wiring layer 21' is exposed to the first surface 23a of the first insulating layer 23.

Therefore, in the fourth embodiment the conductors 42 are not made, such that the cost may be decreased.

The present invention further provides an interposer substrate 2, 2', 3, 3', 4, 4', 5, 5', comprising: a first insulating layer 23, a first wiring layer 21,21', a plurality of first conductive pillars 22, and a plurality of external connection pillars 24.

The first insulating layer 23 has a first surface 23a and a second surface 23b opposing the first surface 23a, and the first insulating layer 23 is molding compound, epoxy or dielectric material.

The first wiring layer 21, 21' is embedded in the first surface 23a of the first insulating layer 23, and the surface 21a of the first wiring layer 21, 21' is lower than the first surface 23a of the first insulating layer 23.

The first conductive pillar 22 is formed in the first insulating layer 23 and is connected to the second surface 23b of the first insulating layer 23, and an end surface 22a of the first conductive pillar 22 is flush with the second surface 23b of the first insulating layer 23.

The external connection pillars 24 are disposed on the first conductive pillar 22, such that the first conductive pillars 22 are electrically connected to the external connection pillars 24 and the first wiring layer 21,21'.

In an embodiment, the interposer substrate 3,3' further comprises a second wiring layer 31 disposed between the second surface 23b of the first insulating layer 23 and the external connection pillars 24, such that the second wiring layer 31 is electrically connected to the external connection pillars 24 and the first conductive pillars 22, and further comprises an insulating protection layer 30 formed on the second surface 23b of the first insulating layer 23 and the second wiring layer 31, such that the insulating protection layer 30 exposes a portion of the second wiring layer 31 from the first insulating layer 23 for providing the electrical contact pads 310 to receive the external connection pillars 24.

In an embodiment, the interposer substrate 4,4' further comprises a wiring build-up layer structure 40 disposed between the second surface 23b of the first insulating layer 23 and the external connection pillars 24, such that the wiring build-up layer structure 40 is electrically connected to the external connection pillars 24 and the first conductive pillars 22. In an embodiment, the wiring build-up layer structure 40 comprises at least a second insulating layer 43, a second wiring layer 41 formed in the second insulating layer 43, and a plurality of conductors 42 disposed in the second insulating layer 43 and on the second wiring layer 41, and the external connection pillars 24 are disposed on the conductors 42. In an embodiment, the conductors 42 are conductive pillars.

In an embodiment, the interposer substrate 5, 5' further comprises a wiring build-up layer structure 50 disposed between the second surface 23b of the first insulating layer 23 and the external connection pillars 24, such that the wiring build-up layer structure 50 is electrically connected to the external connection pillars 24 and the first conductive pillar 22s. In an embodiment, the wiring build-up layer structure 50 comprises at least one second insulating layer 43 and a second wiring layer 41 disposed in the second insulating layer 43, and the external connection pillars 24 is disposed on the second wiring layer 41.

In an embodiment, the interposer substrate 2',3',4',5' further comprises a supporting structure 20' disposed on the first surface 23a of the first insulating layer 23.

In conclusion, the interposer substrate and the method of fabricating the same according to the present invention can be applied to products of the package on package (PoP) with fine spacing and high pin number, and when products tend to be light, thin short, small and faster and to has stronger function and larger storage, the interposer substrate in the present invention is more required.

Further, the interposer substrate of the present invention may be connected to a logic packaging member (logic IC) or a memory packaging member (memory IC) through the external connection pillar, and may be connected to the logic packaging member (logic IC) or the memory packaging member (memory IC) through the first wiring layer.

The above-described embodiments exemplarily explain the principles and effects of the present invention without intending to limit the present invention. Persons skilled in the art can modify the above-described embodiments without departing from the spirit and scope of the present invention. Therefore, the protection scope of the present invention shall be listed as follows.

What is claimed is:

1. An interposer substrate, comprising:
   an insulating body;
   at least a wiring layer formed on one surface of the insulating body;
   a plurality of conductive pillars embedded in the insulating body and connected to the wiring layer; and
   a plurality of external connection pillars disposed on and in direct contact with the conductive pillars, protruding from an outermost surface of the insulating body opposite to the one surface of the insulating body and being free from being embedded in the insulating body,
   wherein the first conductive pillars electrically connect the external connection pillars and the wiring layer, and the external connection pillars are copper pillars.

2. The interposer substrate of claim 1, wherein the insulating body is formed of molding compound, primer or dielectric material.

3. The interposer substrate of claim 1, wherein the wiring layer has a surface lower than the one surface of the insulating body.

4. The interposer substrate of claim 1, wherein an end surface of each of the first conductive pillars is flush with the outermost surface of the insulating body.

5. The interposer substrate of claim 1, further comprising a supporting structure disposed on the one surface of the insulating body.

* * * * *